US012750104B2

United States Patent

(12) United States Patent
Khlat

(10) Patent No.: US 12,750,104 B2
(45) Date of Patent: Sep. 29, 2026

(54) BEAMFORMING PHASE CORRECTION IN A WIRELESS COMMUNICATION CIRCUIT

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 22 days.

(21) Appl. No.: 18/865,965

(22) PCT Filed: May 9, 2023

(86) PCT No.: PCT/US2023/021499
§ 371 (c)(1),
(2) Date: Nov. 14, 2024

(87) PCT Pub. No.: WO2023/239511
PCT Pub. Date: Dec. 14, 2023

(65) Prior Publication Data

US 2025/0309955 A1 Oct. 2, 2025

Related U.S. Application Data

(60) Provisional application No. 63/421,616, filed on Nov. 2, 2022, provisional application No. 63/350,964, filed on Jun. 10, 2022.

(51) Int. Cl.
*H04B 7/06* (2006.01)
*H03H 11/16* (2006.01)

(52) U.S. Cl.
CPC ........... *H04B 7/0617* (2013.01); *H03H 11/16* (2013.01)

(58) Field of Classification Search
CPC .............................. H04B 7/0617; H03H 11/16
See application file for complete search history.

(56) References Cited

U.S. PATENT DOCUMENTS 7,697,903 B2 4/2010 Behzad
7,873,332 B2 1/2011 Behzad
(Continued)

OTHER PUBLICATIONS

Yang, B. et al., "Local Oscillator Phase Shifting and Harmonic Mixing-Based High-Precision Phased Array for 5G Millimeter-Wave Communications," IEEE Transactions on Microwave Theory and Techniques, vol. 67, No. 7, Jul. 2019, IEEE, pp. 3162-3173.
(Continued)

*Primary Examiner* — David S Huang
(74) *Attorney, Agent, or Firm* — Withrow & Terranova, P.L.L.C.

(57) ABSTRACT

Beamforming phase correction in a wireless communication circuit is provided. The wireless communication circuit is configured to emit multiple processed signals, which are generated by applying a codeword to a radio frequency (RF) signal. The codeword defines a set of complex-valued coefficients that will cause each of the processed signals to be associated with a respective one of multiple defined phases such that the processed signals can form an RF beam when emitted simultaneously from multiple antenna elements. However, some or all of the defined phases can be changed, for example, when the processed signals are amplified. In this regard, in embodiments disclosed herein, a phase correction circuit is configured to determine one or more phase correction terms and apply the determined phase correction terms to one or more of the processed signals to thereby correct undesired phase changes and restore coherency among the processed signals.

12 Claims, 4 Drawing Sheets

(56) References Cited

U.S. PATENT DOCUMENTS

| | | | | |
|---|---|---|---|---|
| 9,866,178 | B2 | 1/2018 | Anderson | |
| 10,177,719 | B2 | 1/2019 | Gazneli et al. | |
| 10,270,510 | B1 | 4/2019 | Wang et al. | |
| 10,841,018 | B2 | 11/2020 | Tervo et al. | |
| 10,924,063 | B2 | 2/2021 | Esmael | |
| 11,316,500 | B2 | 4/2022 | Khlat | |
| 2006/0217083 | A1 | 9/2006 | Braithwaite | |
| 2011/0006825 | A1 | 1/2011 | Fludger | |
| 2015/0103955 | A1 | 4/2015 | Bartram | |
| 2017/0331533 | A1* | 11/2017 | Strong | H04L 25/0204 |
| 2018/0006615 | A1 | 1/2018 | Halperin et al. | |
| 2020/0266879 | A1 | 8/2020 | Chia et al. | |
| 2021/0281219 | A1 | 9/2021 | Khlat | |
| 2021/0288632 | A1 | 9/2021 | Khlat | |

OTHER PUBLICATIONS

Yang, J., "Measurement of Amplitude and Phase Differences Between Two RF Signals by Using Signal Power Detection," IEEE Microwave and Wireless Components Letters, vol. 24, No. 3, Mar. 2014, 3 pages.

Notice of Allowance for U.S. Appl. No. 17/186,800, mailed Dec. 29, 2021, 11 pages.

International Search Report and Written Opinion for International Patent Application No. PCT/US2023/021499, mailed Aug. 17, 2023, 17 pages.

* cited by examiner

BEAMFORMING PHASE CORRECTION IN A WIRELESS COMMUNICATION CIRCUIT

RELATED APPLICATIONS

This application is a 35 USC 371 national phase filing of International Application No. PCT/US2023/021499, filed May 9, 2023, which claims the benefit of U.S. provisional patent application Ser. No. 63/350,964, filed on Jun. 10, 2022, and U.S. provisional patent application Ser. No. 63/421,616, filed on Nov. 2, 2022, the disclosures of which are hereby incorporated herein by reference in their entireties.

FIELD OF THE DISCLOSURE

The technology of the disclosure relates generally to radio frequency (RF) beamforming.

BACKGROUND

Mobile communication devices have become increasingly common in current society. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as Wi-Fi, long-term evolution (LTE), and fifth-generation new-radio (5G-NR). 5G-NR, in particular, relies on multiple input-multiple output (MIMO) techniques to enable high-bandwidth communication where plural antennas may transmit multiple signals that have been shaped or steered by a beamforming circuit that adjusts relative phases of the signals.

SUMMARY

Aspects disclosed in the detailed description include beamforming phase correction in a wireless communication circuit. The wireless communication circuit is configured to emit multiple processed signals, which are generated by applying a codeword to a radio frequency (RF) signal. The codeword defines a set of complex-valued coefficients that will cause each of the processed signals to be associated with a respective one of multiple defined phases such that the processed signals can form an RF beam when emitted simultaneously from multiple antenna elements. However, some or all of the defined phases can be changed, for example, when the processed signals are amplified. In this regard, in embodiments disclosed herein, a phase correction circuit is configured to determine one or more phase correction terms and apply the determined phase correction terms to one or more of the processed signals to thereby correct undesired phase changes and restore coherency among the processed signals.

In one aspect, a phase correction circuit is provided. The phase correction circuit includes multiple phase correction lookup tables (LUTs). Each of the multiple phase correction LUTs is pre-calibrated to store one or more phase correction terms. The phase correction circuit also includes a control circuit. The control circuit is configured to determine a respective one of multiple phase correction terms for a respective one of multiple processed signals based on the one or more phase correction terms stored in a respective one of the multiple phase correction LUTs. The phase correction circuit also includes multiple phase shifters. Each of the multiple phase shifters is configured to receive a respective one of the multiple processed signals associated with a respective one of multiple predefined phases. Each of the multiple phase shifters is also configured to receive a respective one of the multiple phase correction terms from the control circuit. Each of the multiple phase shifters is also configured to phase shift the respective one of the multiple processed signals by a combination of the respective one of the multiple predefined phases and the respective one of the multiple phase correction terms.

In another aspect, a transceiver circuit is provided. The transceiver circuit includes a signal processing circuit. The signal processing circuit is configured to generate an RF signal. The transceiver circuit also includes a beamformer circuit. The beamformer circuit is configured to process the RF signal to generate multiple processed signals each associated with a respective one of multiple predefined phases. The transceiver circuit also includes a phase correction circuit. The phase correction circuit is configured to determine multiple phase correction terms for the multiple processed signals, respectively. The phase correction circuit is also configured to apply the multiple determined phase correction terms to the multiple predefined phases, respectively.

In another aspect, a wireless communication circuit is provided. The wireless communication circuit includes a transceiver circuit. The transceiver circuit includes a signal processing circuit. The signal processing circuit is configured to generate an RF signal. The transceiver circuit also includes a beamformer circuit. The beamformer circuit is configured to process the RF signal to generate multiple processed signals each associated with a respective one of multiple predefined phases. The transceiver circuit also includes a phase correction circuit. The phase correction circuit is configured to determine multiple phase correction terms for the multiple processed signals, respectively. The phase correction circuit is also configured to apply the multiple determined phase correction terms to the multiple predefined phases, respectively.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
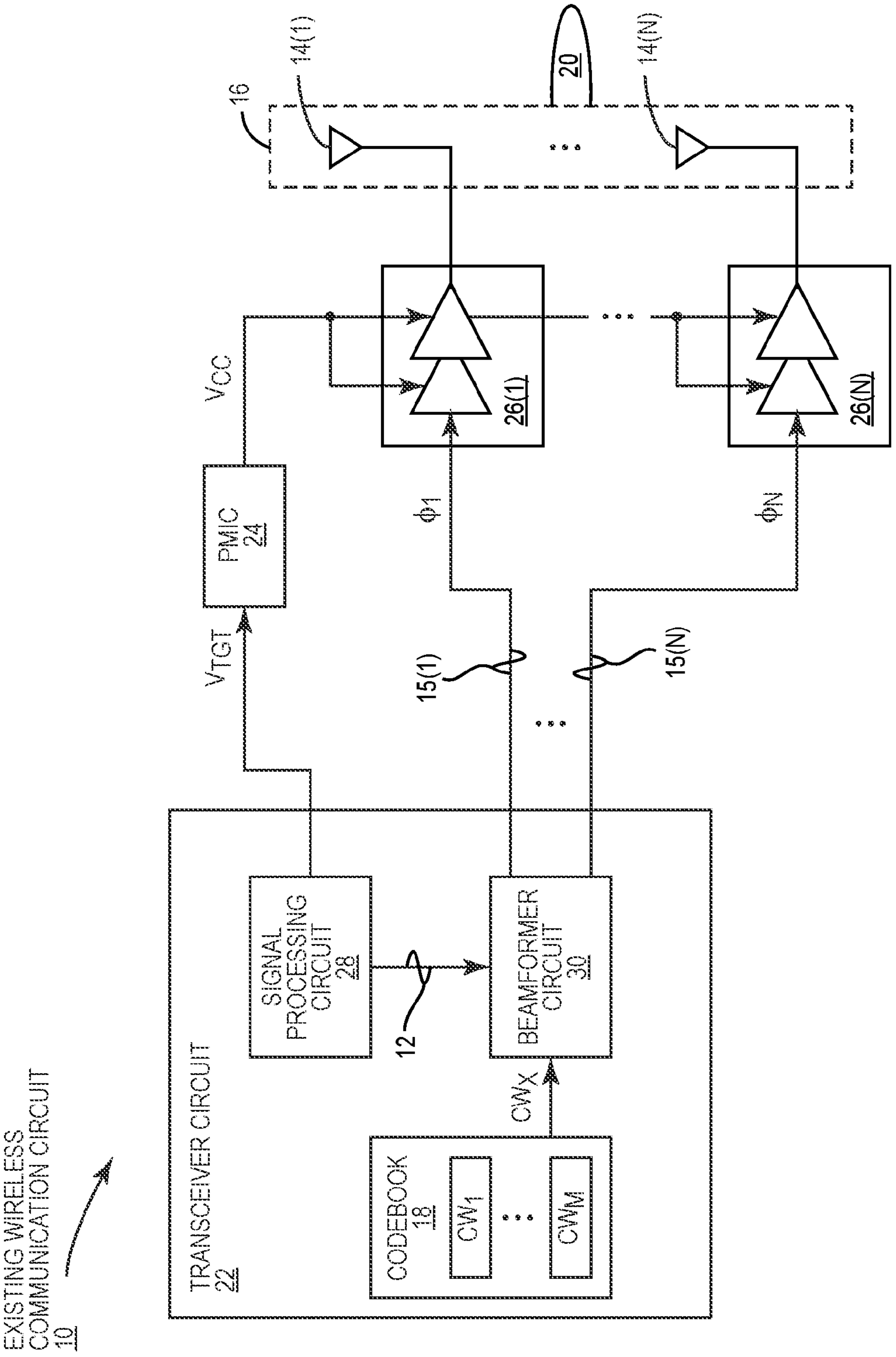
FIG. 1 (RELATED ART)
FIG. 1 is a schematic diagram of an exemplary existing wireless communication circuit configured to emit a radio frequency (RF) signal via RF beamforming.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include beamforming phase correction in a wireless communication circuit. The wireless communication circuit is configured to emit multiple processed signals, which are generated by applying a codeword to a radio frequency (RF) signal. The codeword defines a set of complex-valued coefficients that will cause each of the processed signals to be associated with a respective one of multiple defined phases such that the processed signals can form an RF beam when emitted simultaneously from multiple antenna elements. However, some or all of the defined phases can be changed, for example, when the processed signals are amplified. In this regard, in embodiments disclosed herein, a phase correction circuit is configured to determine one or more phase correction terms and apply the determined phase correction terms to one or more of the processed signals to thereby correct undesired phase changes and restore coherency among the processed signals.

Figure 2:
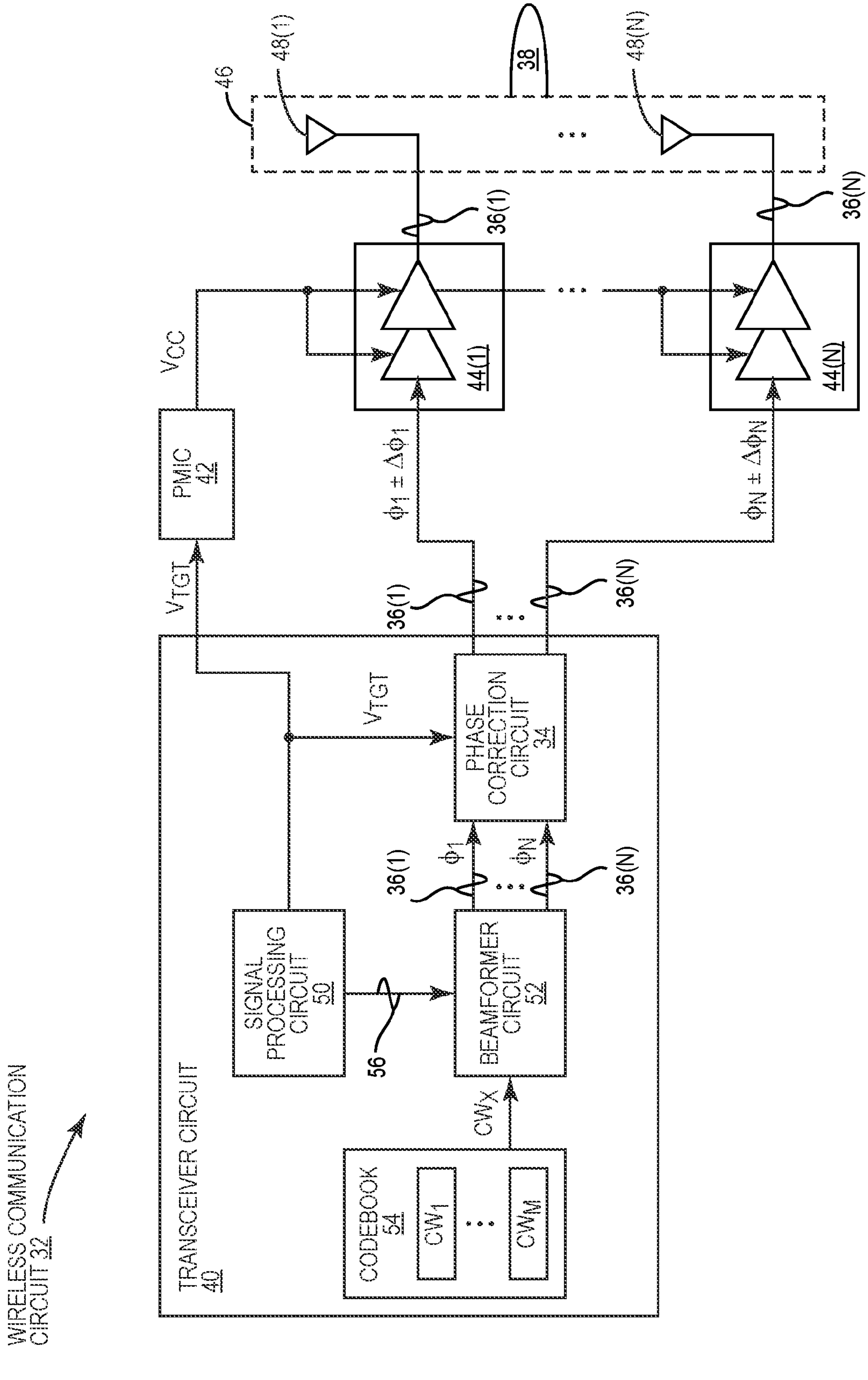
FIG. 2 is a schematic diagram of an exemplary wireless communication circuit wherein a phase correction circuit is configured according to embodiments of the present disclosure to enable beamforming phase correction in some or all of multiple processed signals to ensure phase coherency in an RF beam.

Before discussing the wireless communication circuit of the present disclosure, starting at FIG. 2, a brief discussion of an existing wireless communication circuit is first provided with reference to FIG. 1 to help understand some phase alignment issues in the existing wireless communication circuit.

FIG. 1 is a schematic diagram of an existing wireless communication circuit 10 configured to emit an RF signal 12 via RF beamforming. In general, RF beamforming refers to a technique that uses multiple antenna elements 14(1)-14(N) to simultaneously emit the RF signal 12. The antenna elements 14(1)-14(N) are typically organized into an antenna array 16 (e.g., 4×4, 8×8, 16×16, etc.) and separated from each other by a distance (e.g., ½ wavelength). The RF signal 12 is preprocessed based on a selected one (denoted as $CW_X$, $1 \le X \le M$) of multiple codewords $CW_1$-$CW_M$ in a codebook 18 to generate multiple processed RF signals 15(1)-15(N). Each of the codewords $CW_1$-$CW_M$ represents a set of complex-valued coefficients and is physically realized through phase and/or amplitude control applied to the RF signal 12 to thereby maximize antenna array gain in a specific direction. By applying the selected codeword $CW_X$ to the RF signal 12, each of the processed signals 15(1)-15(N) will be associated with a respective one of multiple phases $\phi_1$-$\phi_N$ that will provide phase coherency to ensure that the processed signals 15(1)-15(N) can form an RF beam 20 described by gain, intensity, power, and/or electric/magnetic field values versus elevation and azimuth directions. In this regard, it can be said that the RF beam 20 is associated with, or defined by, the selected codeword $CW_X$. In other words, there may be a one-to-one relationship between the RF beam 20 and the selected codeword $CW_X$. Accordingly, the codewords $CW_1$-$CW_M$ in the codebook 18 can define M different RF beams.

The existing wireless communication circuit 10 includes a transceiver circuit 22, a power management integrated circuit (PMIC) 24, and multiple power amplifier circuits 26(1)-26(N). The transceiver circuit 22 includes a signal processing circuit 28 that generates the RF signal 12. The transceiver circuit 22 also includes a beamformer circuit 30 configured to determine the selected codeword $CW_X$ from the codebook 18 and apply the selected codeword $CW_X$ to the RF signal 12 to generate the processed signals 15(1)-15 (N).

The power amplifier circuits 26(1)-26(N) are coupled to the beamformer circuit 30 and configured to amplify the processed signals 15(1)-15(N), respectively, based on a modulated voltage $V_{CC}$. The PMIC 24 is configured to generate the modulated voltage $V_{CC}$ based on a modulated target voltage $V_{TGT}$ and provide the modulated voltage $V_{CC}$ to each of the power amplifier circuits 26(1)-26(N). The signal processing circuit 28, on the other hand, is configured to generate the modulated target voltage $V_{TGT}$ in accordance with a time-variant power envelope of the RF signal 12.

Typically, each of the codewords $CW_1$-$CW_N$ is determined based on an assumption that each of the antenna elements 14(1)-14(N) will have a relatively constant impedance. However, temperature fluctuations in the power amplifier circuits 26(1)-26(N) and/or at the antenna array 16 may cause changes of impedance outside the assumed constant impedance tolerances, resulting in voltage standing wave ratio (VSWR) variations that can cause some or all of the defined phases $\phi_1$-$\phi_N$ to change. Consequently, the processed signals 15(1)-15(N) may lose phase coherency to negatively impact receivability of the RF beam 20 at a receiving end (e.g., receiver). Hence, it is desirable to correct any potential phase change in any of the processed signals 15(1)-15(N) to maintain phase coherency in the RF beam 20.

In this regard, FIG. 2 is a schematic diagram of an exemplary wireless communication circuit 32 wherein a phase correction circuit 34 is configured according to embodiments of the present disclosure to enable beamforming phase correction in some or all of multiple processed signals 36(1)-36(N) to ensure phase coherency in an RF beam 38. As described in detail below, the phase correction circuit 34 is configured to determine multiple phase correction terms $\Delta\phi_1$-$\Delta\phi_N$ and apply the determined phase correction terms $\Delta\phi_1$-$\Delta\phi_N$ to the processed signals 36(1)-36(N) to thereby correct any phase error in the processed signals 36(1)-36(N). As a result, the wireless communication circuit 32 can ensure phase coherency in the RF beam 38 to thereby improve receivability of the RF beam 38 at a receiving end (e.g., receiver).

The wireless communication circuit 32 includes a transceiver circuit 40, a PMIC 42, and multiple power amplifier circuits 44(1)-44(N). The wireless communication circuit 32 also includes an antenna array 46. The antenna array 46 includes multiple antenna elements 48(1)-48(N) each coupled to a respective one of the power amplifier circuits 44(1)-44(N).

Specifically, the power amplifier circuits 44(1)-44(N) are configured to amplify the processed signals 36(1)-36(N), respectively, based on a modulated voltage $V_{CC}$ (e.g., an envelope tracking voltage or an average power tracking voltage). The antenna elements 48(1)-48(N) are configured to emit the amplified processed signals 36(1)-36(N) simultaneously to thereby form the RF beam 38.

According to an embodiment of the present disclosure, the transceiver circuit 40 includes a signal processing circuit 50, a beamformer circuit 52, and a codebook 54. The signal processing circuit 50, which can further include various digital and analog processing circuits, is configured to generate an RF signal 56 and a modulated target voltage $V_{TGT}$ that tracks a time-variant power envelope of the RF signal 56. The signal processing circuit 50 is configured to provide the modulated target voltage $V_{TGT}$ to the PMIC 42, which will generate the modulated voltage $V_{CC}$ accordingly.

Similar to the codebook 18 in FIG. 1, the codebook 54 is preconfigured to store multiple codewords $CW_1$-$CW_M$. As previously discussed in FIG. 1, each of the codewords $CW_1$-$CW_M$ represents a set of complex-valued coefficients and is physically realized through phase and/or amplitude control applied to the RF signal 56 to thereby maximize antenna array gain in a specific direction.

The beamformer circuit 52 is configured to determine a selected codeword $CW_X$ among the codewords $CW_1$-$CW_M$ in the codebook 54 and apply the selected codeword $CW_X$ to the RF signal 56 to generate the processed signals 36(1)-36(N). Understandably, from the previous discussion in FIG. 1, each of the processed signals 36(1)-36(N) will be associated with a respective one of multiple predefined phases $\phi_1$-$\phi_N$ that will provide phase coherency to ensure that the processed signals 36(1)-36(N) can coherently form the RF beam 38 in a desired direction.

As previously mentioned in FIG. 1, some or all of the defined phases $\phi_1$-$\phi_N$ may be changed due to, for example, VSWR variation experienced by the power amplifier circuits 44(1)-44(N) and/or the antenna elements 48(1)-48(N). In this regard, the phase correction circuit 34 is configured to determine the phase correction terms $\Delta\phi_1$-$\Delta\phi_N$ for the processed signals 36(1)-36(N) to compensate for any change among the defined phases $\phi_1$-$\phi_N$. Accordingly, the phase correction circuit 34 adds or subtracts each of the determined phase correction terms $\Delta\phi_1$-$\Delta\phi_N$ to or from a respective one or more of the predefined phases $\phi_1$-$\phi_N$. By performing phase correction, it is possible to correct undesired phase changes in any of the predefined phases $\phi_1$-$\phi_N$ and restore coherency among the processed signals 36(1)-36(N).

Figure 3:
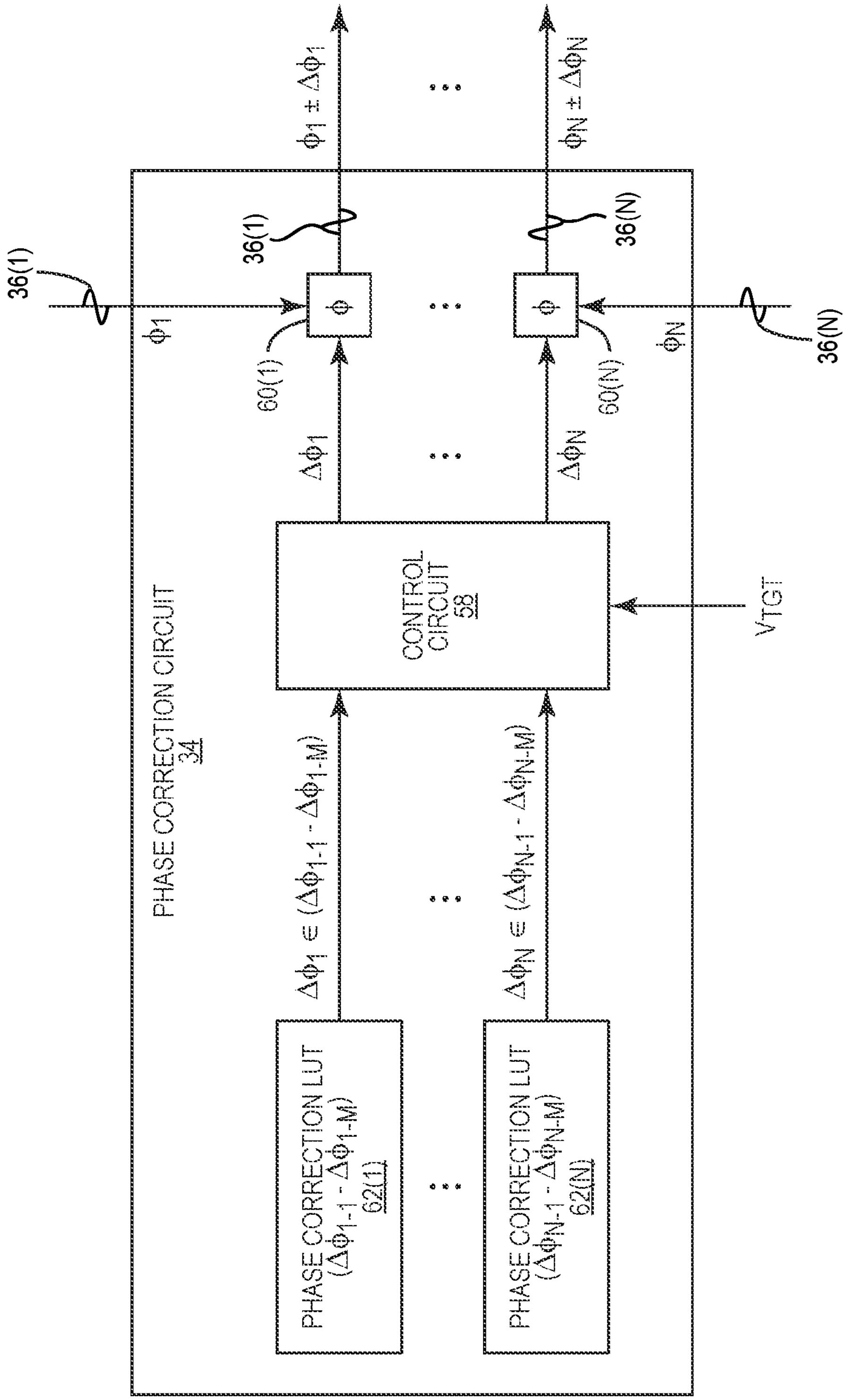
FIG. 3 is a schematic diagram providing an exemplary illustration of the phase correction circuit in FIG. 2.

FIG. 3 is a schematic diagram providing an exemplary illustration of the phase correction circuit 34 in FIG. 2. Common elements between FIGS. 2 and 3 are shown therein with common element numbers and will not be re-described herein.

According to an embodiment of the present disclosure, the phase correction circuit 34 includes a control circuit 58 and multiple phase shifters 60(1)-60(N). The phase shifters 60(1)-60(N) are each configured to phase shift a respective one of the processed signals 36(1)-36(N) by a respective one of the predefined phases 1-ØN. In addition, each of the phase shifters 60(1)-60(N) is also configured to add or subtract a respective one of the phase correction terms $\Delta\phi_1$-$\Delta\phi_N$ to a respective one of the predefined phases $\phi_1$-$\phi_N$. In other words, each of the phase shifters 60(1)-20(N) will phase shift a respective one of the processed signals 36(1)-36(N) by a combination of a respective one of the predefined phases $\phi_1$-$\phi_N$ and a respective one of the phase correction terms $\Delta\phi_1$-$\Delta\phi_N$.

The control circuit 58 includes multiple phase correction lookup tables (LUTs) 62(1)-62(N). The phase correction LUTs 62(1)-62(N) may each be calibrated by comparing a respective one of the processed signals 36(1)-36(N) against a reference signal to extract a respective one of the phase correction terms $\Delta\phi_1$-$\Delta\phi_N$ resulted from variation of the modulated voltage $V_{CC}$. For more details on phase correction LUT calibration, please refer to U.S. Pat. No. 11,316,500 B2, entitled "BEAMFORMING WITH PHASE CORRECTION."

In an embodiment, each of the phase correction LUTs 62(1)-62(N) may be pre-calibrated to store a respective one or more phase correction terms $\Delta\phi_{i-1}$-$\Delta\phi_{i-M}$ ($1 \le i \le N$). Specifically, the phase correction terms $\Delta\phi_{i-1}$-$\Delta\phi_{i-M}$ in each of the phase correction LUTs 62(1)-62(N) may correspond to a respective modulated target voltage $V_{TGT}$. For example, the phase correction LUT 62(1) can store one or more phase correction terms $\Delta\phi_{1-1}$-$\Delta\phi_{1-M}$, each corresponding to, for example, a respective modulated target voltage $V_{TGT}$. In an embodiment, one of the phase correction terms $\Delta\phi_{i-1}$-$\Delta\phi_{i-M}$ in each of the phase correction LUTs 62(1)-62(N) may be equal to zero degree (0°).

In a non-limiting example, the control circuit 58 is configured to receive the modulated target voltage $V_{TGT}$ from the signal processing circuit 50. Accordingly, the control circuit 58 can determine each of the phase correction terms $\Delta\phi_1$-$\Delta\phi_N$ by selecting one of the phase correction terms $\Delta\phi_{i-1}$-$\Delta\phi_{i-M}$ in a respective one of the phase correction LUTs 62(1)-62(N) based on the received modulated target voltage $V_{TGT}$. For example, the phase correction LUT 62(1) can determine the phase correction term $\Delta\phi_1$ by selecting one of the stored phase correction terms $\Delta\phi_{1-1}$-$\Delta\phi_{1-M}$ ($\Delta\phi_1 \in (\Delta\phi_{1-1}$-$\Delta\phi_{1-M})$) based on the received modulated target voltage $V_{TGT}$. Similarly, the phase correction LUT 62(N) can determine the phase correction term $\Delta\phi_N$ by selecting one of the stored phase correction terms $\Delta\phi_{N-1}$-$\Delta\phi_{N-M}$ ($\Delta\phi_N \in (\Delta\phi_{N-1}$-$\Delta\phi_{N-M})$) based on the received modulated target voltage $V_{TGT}$. The control circuit 58 can then provide the phase correction terms $\Delta\phi_1$-$\Delta\phi_N$ to the phase shifters 60(1)-60(N), respectively.

In another embodiment, each of the phase correction LUTs 62(1)-62(N) may be further calibrated to store the phase correction terms $\Delta\phi_{i-1}$-$\Delta\phi_{i-M}$ ($1 \leq i \leq N$) each associated with a respective VSWR estimate. In this regard, the control circuit 58 may be further configured to determine the phase correction terms $\Delta\phi_1$-$\Delta\phi_N$ by selecting one of the phase correction terms $\Delta\phi_{i-1}$-$\Delta\phi_{i-M}$ in a respective one of the phase correction LUTs 62(1)-62(N) based on a respective VSWR estimate for a respective one of the power amplifier circuits 44(1)-44(N). In a non-limiting example, the respective VSWR estimate for each of the power amplifier circuits 44(1)-44(N) can be determined based on such factors as transmission frequency, temperature, and/or load impedance.

Figure 4:
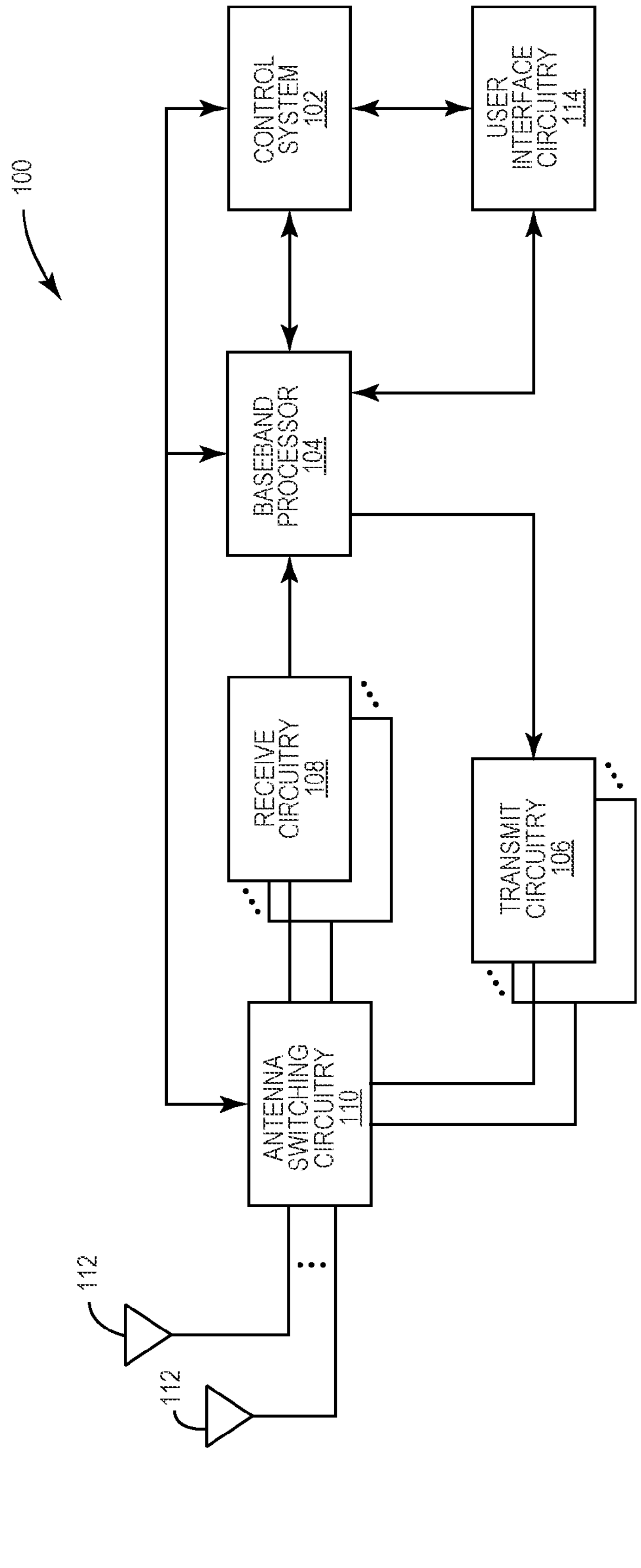
FIG. 4 is a schematic diagram of an exemplary user element wherein the wireless communication circuit of FIG. 2 can be provided.

The wireless communication circuit 32 of FIG. 2 can be provided in a user element to provide beamforming phase correction. FIG. 4 is a schematic diagram of an exemplary user element 100 wherein the wireless communication circuit 32 of FIG. 2 can be provided.

Herein, the user element 100 can be any type of user elements, such as mobile terminals, smart watches, tablets, computers, navigation devices, access points, and like wireless communication devices that support wireless communications, such as cellular, wireless local area network (WLAN), Bluetooth, and near field communications. The user element 100 will generally include a control system 102, a baseband processor 104, transmit circuitry 106, receive circuitry 108, antenna switching circuitry 110, multiple antennas 112, and user interface circuitry 114. In a non-limiting example, the control system 102 can be a field-programmable gate array (FPGA), as an example. In this regard, the control system 102 can include at least a microprocessor(s), an embedded memory circuit(s), and a communication bus interface(s). The receive circuitry 108 receives radio frequency signals via the antennas 112 and through the antenna switching circuitry 110 from one or more base stations. A low noise amplifier and a filter cooperate to amplify and remove broadband interference from the received signal for processing. Downconversion and digitization circuitry (not shown) will then downconvert the filtered, received signal to an intermediate or baseband frequency signal, which is then digitized into one or more digital streams using analog-to-digital converter(s) (ADC).

The baseband processor 104 processes the digitized received signal to extract the information or data bits conveyed in the received signal. This processing typically comprises demodulation, decoding, and error correction operations, as will be discussed in greater detail below. The baseband processor 104 is generally implemented in one or more digital signal processors (DSPs) and application specific integrated circuits (ASICs).

For transmission, the baseband processor 104 receives digitized data, which may represent voice, data, or control information, from the control system 102, which it encodes for transmission. The encoded data is output to the transmit circuitry 106, where a digital-to-analog converter(s) (DAC) converts the digitally encoded data into an analog signal and a modulator modulates the analog signal onto a carrier signal that is at a desired transmit frequency or frequencies. A power amplifier will amplify the modulated carrier signal to a level appropriate for transmission, and deliver the modulated carrier signal to the antennas 112 through the antenna switching circuitry 110. The multiple antennas 112 and the replicated transmit and receive circuitries 106, 108 may provide spatial diversity. Modulation and processing details will be understood by those skilled in the art.

Those skilled in the art will recognize improvements and modifications to the embodiments of the present disclosure. All such improvements and modifications are considered within the scope of the concepts disclosed herein and the claims that follow.

What is claimed is:

1. A phase correction circuit comprising:

a plurality of phase correction lookup tables (LUTs) each pre-calibrated to store one or more phase correction terms;

a control circuit configured to determine a respective one of a plurality of phase correction terms for a respective one of a plurality of processed signals based on the one or more phase correction terms stored in a respective one of the plurality of phase correction LUTs; and a plurality of phase shifters each configured to:

receive a respective one of the plurality of processed signals associated with a respective one of a plurality of predefined phases;

receive a respective one of the plurality of phase correction terms from the control circuit; and phase shift the respective one of the plurality of processed signals by a combination of the respective one of the plurality of predefined phases and the respective one of the plurality of phase correction terms.

2. The phase correction circuit of claim 1, wherein the control circuit is further configured to determine each of the plurality of phase correction terms by selecting one of the one or more phase correction terms stored in a respective one of the phase correction LUTs based on a modulated target voltage.

3. The phase correction circuit of claim 1, wherein the control circuit is further configured to determine each of the plurality of phase correction terms by selecting one of the one or more phase correction terms stored in a respective one of the phase correction LUTs based on a respective voltage standing wave ratio (VSWR) estimate.

4. A transceiver circuit comprising:

a signal processing circuit configured to generate a radio frequency (RF) signal;

a beamformer circuit configured to process the RF signal to generate a plurality of processed signals each associated with a respective one of a plurality of predefined phases;

a phase correction circuit comprising:

a plurality of phase correction lookup tables (LUTs) each pre-calibrated to store one or more phase correction terms;

a control circuit configured to determine a respective one of a plurality of phase correction terms for a respective one of a plurality of processed signals based on the one or more phase correction terms stored in a respective one of the plurality of phase correction LUTs; and a plurality of phase shifters each configured to:

receive a respective one of the plurality of processed signals associated with a respective one of a plurality of predefined phases;

receive a respective one of the plurality of phase correction terms from the control circuit; and phase shift the respective one of the plurality of processed signals by a combination of the respective one of the plurality of predefined phases and the respective one of the plurality of phase correction terms.

5. The transceiver circuit of claim 4, wherein the beamformer circuit is further configured to apply a selected one of a plurality of codewords to the RF signal to thereby generate the plurality of processed signals each associated with the respective one of the plurality of predefined phases.

6. The transceiver circuit of claim 4, wherein the control circuit is further configured to determine each of the plurality of phase correction terms by selecting one of the one or more phase correction terms stored in a respective one of the phase correction LUTs based on a modulated target voltage.

7. The transceiver circuit of claim 4, wherein the control circuit is further configured to determine each of the plurality of phase correction terms by selecting one of the one or more phase correction terms stored in a respective one of the phase correction LUTs based on a respective voltage standing wave ratio (VSWR) estimate.

8. A wireless communication circuit comprising:

a transceiver circuit comprising:

a signal processing circuit configured to generate a radio frequency, RF, signal;

a beamformer circuit configured to process the RF signal to generate a plurality of processed signals each associated with a respective one of a plurality of predefined phases; and a phase correction circuit comprising:

a plurality of phase correction lookup tables (LUTs) each pre-calibrated to store one or more phase correction terms;

a control circuit configured to determine a respective one of a plurality of phase correction terms for a respective one of a plurality of processed signals based on the one or more phase correction terms stored in a respective one of the plurality of phase correction LUTs; and a plurality of phase shifters each configured to:

receive a respective one of the plurality of processed signals associated with a respective one of a plurality of predefined phases;

receive a respective one of the plurality of phase correction terms from the control circuit; and phase shift the respective one of the plurality of processed signals by a combination of the respective one of the plurality of predefined phases and the respective one of the plurality of phase correction terms.

9. The wireless communication circuit of claim 8, wherein the beamformer circuit is further configured to apply a selected one of a plurality of codewords to the RF signal to thereby generate the plurality of processed signals each associated with the respective one of the plurality of predefined phases.

10. The wireless communication circuit of claim 8, wherein the control circuit is further configured to determine each of the plurality of phase correction terms by selecting one of the one or more phase correction terms stored in a respective one of the phase correction LUTs based on a modulated target voltage.

11. The wireless communication circuit of claim 8, wherein the control circuit is further configured to determine each of the plurality of phase correction terms by selecting one of the one or more phase correction terms stored in a respective one of the phase correction LUTs based on a respective voltage standing wave ratio (VSWR) estimate.

12. The wireless communication circuit of claim 8, further comprising:

a power management integrated circuit (PMIC) configured to generate a modulated voltage based on a modulated target voltage that tracks a time-variant power envelope of the RF signal;

a plurality of power amplifier circuits each configured to amplify a respective one of the plurality of processed signals based on the modulated voltage; and a plurality of antenna elements coupled to the plurality of power amplifier circuits and configured to emit the plurality of amplified processed signals simultaneously to thereby form an RF beam.

* * * * *